United States Patent
Clark

(10) Patent No.: US 6,849,388 B2
(45) Date of Patent: Feb. 1, 2005

(54) SELF-ALIGNING CONTACTS FOR STACKED ELECTRONICS

(75) Inventor: Stewart A. Clark, Newport Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 181 days.

(21) Appl. No.: 10/277,863

(22) Filed: Oct. 22, 2002

(65) Prior Publication Data

US 2004/0081920 A1 Apr. 29, 2004

(51) Int. Cl.⁷ ................................................. G03F 7/20
(52) U.S. Cl. ...................................... 430/311; 430/395
(58) Field of Search ............................... 430/311, 322, 430/394, 395

(56) References Cited

U.S. PATENT DOCUMENTS

| | | | |
|---|---|---|---|
| 4,379,833 A | * 4/1983 | Canavello et al. | 430/325 |
| 5,981,150 A | 11/1999 | Aoki et al. | 257/774 |
| 6,031,291 A | 2/2000 | Sato et al. | 430/322 |
| 6,165,896 A | * 12/2000 | Schnabel et al. | 438/636 |

* cited by examiner

Primary Examiner—Kathleen Duda
(74) Attorney, Agent, or Firm—Stetina Brunda; Garred & Brucker

(57) ABSTRACT

A method for providing self-aligned contact pads along an edge face of stacked electronics utilizes reflected light from the metal contact leads to define their location. A thin layer of light sensitive polymer is applied over the edge face, at which incident light is directed. A solvent developer is applied which dissolves the polymer where the reflected light passed. In a two-pass technique reflected light destroys an inhibitor in the polymer, and that portion of the layer is dissolved by a developer to delineate voids for contact pads. In a wavefront cancellation technique reflected light is 180° out of phase with the first pass of light, the combination not cross-linking molecules in the polymer, and that portion of the layer is dissolved to delineate voids for contact pads. In an alternative embodiment, a laser interrogation technique, a first incident light outside the absorption spectrum is reflected off the metal contacts leads, and a second incident light within the absorption spectrum is directed at the detected locations of the reflected light, those portions of the polymer in turn dissolved by the developer. The above method provides non-mechanical photo-lithographic techniques to accurately delineate voids for contact pads.

23 Claims, 1 Drawing Sheet

SELF-ALIGNING CONTACTS FOR STACKED ELECTRONICS

FIELD OF THE INVENTION

The present invention relates generally to a method for providing contacts along edge faces of stacked electronics, and more particularly to utilizing differences in reflective properties in materials to delineate contact pads in insulating layers of light-sensitive polymers.

BACKGROUND OF THE INVENTION

Space-based surveillance systems use infrared detectors coupled to computerized data processors for monitoring heated objects and their movements in the atmosphere below and on the ground. The infrared spectrum covers a wide range of wavelengths, from about 0.75 micrometers to 1 millimeter. The function of infrared detectors is to respond to energy of a wavelength within some particular portion of the infrared region. Heated objects dissipate thermal energy having characteristic wavelengths within the infrared spectrum. Different levels of thermal energy, corresponding to different source temperatures, are characterized by the emission of signals with intensity peaks on different portions of the infrared frequency spectrum. Detectors are selected in accordance with their sensitivity in the range of interest to the designer. Similarly, electronic circuitry that receives and processes the signals from the infrared detectors is also selected in view of the intended detection function.

Current infrared detection systems incorporate arrays of large numbers of discrete, highly sensitive detector elements the outputs of which are connected to sophisticated processing circuitry. By rapidly analyzing the pattern and sequence of detector element excitation, the system circuitry can identify and monitor sources of infrared radiation. It is difficult, however, to actually construct structures that mate a million or more detector elements and associated circuitry in a reliable and practical manner. Considerable difficulties are presented in aligning the detector elements with conductors on the connecting module and in isolating adjacent conductors in such a dense environment. Consequently, practical applications for contemporary infrared detection systems have necessitated that further advances be made in areas such as miniaturization of the detector array and accompanying circuitry, and improvements in the reliability and economical production of the detector array and accompanying circuitry.

In the prior art, a number of detector array modules have been proposed for coupling an array of closely spaced detectors to processing circuitry. Such modules are typically formed such that all connection to and from the module are disposed on a first horizontal layer, with electronic devices and connecting circuitry disposed within the module on one of several stacked horizontal layers interconnected by vertical conductors, known as vias, extending through the layers. A principal shortcoming of this construction is that a single layer is unduly congested with connections to all detectors and external electronics and must also support a large number of vias extending to the parallel layers. The number of detector elements that may be connected as well as the number of connectors to external electronics that support on-focal plane processors are thereby limited by the size of the connecting layer and the minimum width and spacing of the conductors.

Other modules proposed in the prior art address the congestion and space optimization by orienting the detector array perpendicular to the plane of the module layers, adjacent to one edge of the module. Such constructions are commonly referred to as "Z-technology architectures". Z-technology modules are typically formed by stacking multiple layers of thin-film substrates and bump bonding an end of each layer to an adjacent row of the detector array. Conductors extending along the surface of the substrates have end portions that are carefully aligned to contact leads from the individual detector elements. Such constructions advantageously avoid wiring congestion associated with connecting all detectors to a single module layer and reduce the accompanying need for vertical vias that detract from the useable space with the module. The detector arrays have pixels which are typically less than a 100 microns apart and are integrated to the modules by flip-chip bump bonding.

To maintain an interconnect directly behind each pixel in the Z direction the module layers must be kept very thin and very close together. The contact leads at the edge faces of the stacked electronics are located upon a conductive layer of approximately 1 micron thickness. A photo-resist pattern to keep the contact leads from bridging to the substrate is not producible to the necessary tolerances. The existing method to connect up contact leads at the edge faces requires that the substrate is etched back so the contact leads protrude from the edge, and an insulating layer is deposited over the edge. The tips of the leads are then lightly lapped to expose the metal contact and delineate a pad around it. Although the existing method has proven generally suitable, it too has producibility problems associated with it. The mechanical lapping parameters are difficult to stabilize and control.

In view of the shortcomings of the existing method, it is desirable to provide a non-mechanical method to delineate precisely located contact pads along the stack edged faces. One way the problem may be addressed is by using a depth-sensitive laser to ablate the coating over the protruding leads. But, that is not a complete remedy as the step of etching back the substrate around the leads is not eliminated.

SUMMARY OF THE INVENTION

The present invention specifically addresses and alleviates the above-mentioned deficiencies associated with the prior art. Generally, the present invention comprises a method for delineating removal of a light-sensitive polymer layer overlying a conductive material. The method utilizes reflected light off the conductive material to define the location of the conductive material. A solvent developer is applied which dissolves the polymer where both the incident light and the reflected light passes through the layer.

In one aspect of the invention, the two-pass technique, a layer of positive photo-responsive polymer is applied over the conductive and non-conductive materials. Incident light is directed at a first portion of the polymer. Incident light reflects back off the conductive material, passing through a second portion of the polymer. An inhibitor in the polymer is neutralized only in the regions common to both the first and second portions of the polymer (i.e., through which the incident and reflected light has passed). A solvent developer is applied which dissolves the polymer only in the common regions where the inhibitor has been neutralized.

In a second aspect of the invention, the wave-front cancellation technique, a layer of negative photo-responsive polymer is applied. An incident light is directed at a first portion of the polymer. Incident light reflects back off the conductive material, and the reflected light passes through a second portion of the polymer. A suitable thickness of photo-resist provides that the wavelength of the reflected light is substantially 180° out of phase with the incident light. Cross-linking of molecules in the polymer occurs only in regions of the first portion not common to the second portion. A solvent developer dissolves the polymer where the cross-linking has not been activated.

In an alternate embodiment of the invention, a second incident light is directed at the detected locations of reflected light, which in turn are dissolved by the developer. Using a laser interrogation technique, a layer of photo-responsive polymer is again applied over conductive and non-conductive materials. A first incident light outside the absorption spectrum is directed at a first portion of the polymer. Incident light reflects back off the conductive material, and is detected. A second incident light within the absorption spectrum is directed at a second portion of the layer where the reflected light was detected. The second incident light neutralizes the inhibitor in the polymer. A solvent developer dissolves the polymer only in the second portion of the layer where the inhibitor has been neutralized.

The present invention provides non-mechanical photo-lithographic methods to delineate self-aligned contact pads. The present invention utilizes the light reflected back off the metal contacts, to define the area of the contact pads in the insulating layer. These as well as other advantages of the present invention will become more apparent from the following description and drawings. It is understood that changes in the specific structure shown and described may be made within the scope of the claims without departing from the spirit of the invention.

DETAILED DESCRIPTION OF THE PREFERRED EMBODIMENT

The detailed discussion set forth below in connection with the appended drawings is intended as a description of the presently preferred embodiments of the invention, and is not intended to represent the only forms in which the present invention may be constructed or utilized. The description sets forth the functions and sequence of steps for constructing and operating the invention in connection with the illustrated embodiments. It is to be understood, however, that the same or equivalent functions and sequences may be accomplished by different embodiments that are also intended to be encompassed within the scope and spirit of the invention.

Figure 1:
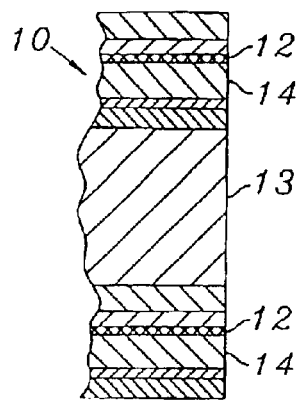
FIG. 1 is an enlarged cross-sectional view of a stacked electronics assembly.
Figure 2:
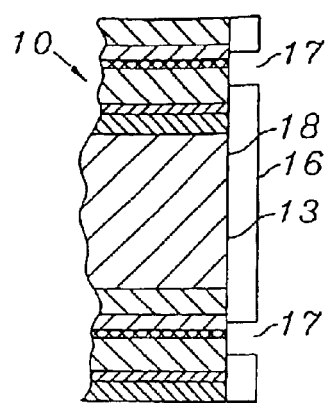
FIG. 2 is a view of a desired insulating layer pattern.

The prior art structure and methods are illustrated in FIGS. 1–4, and the present invention is described in connection with FIGS. 5–8. Referring now to FIG. 1, an enlarged view of typical edge of stacked electronics 10 used in connection with an infrared detection system is shown. The metal contact leads 12 on the edge face 13 of stacked silicon electronics 10 are located on top of a 1 micron thick SiO$_2$ layer 14. Referring to FIG. 2, an desired photo-resist pattern 16 is shown. Alignment of the photo-resist pattern 16 to the stacked electronics 10 mechanically over an edge face 13 of up to one half square inch in total thickness results in run out tolerances from 2–12 microns, making the desired pattern unproducible. If the delineated void 17 is misaligned, the conventional contact pad (not shown) formed therein may cause the contact lead 12 to be bridged to the silicon substrate 18, and the circuit will not work.

Figure 3:
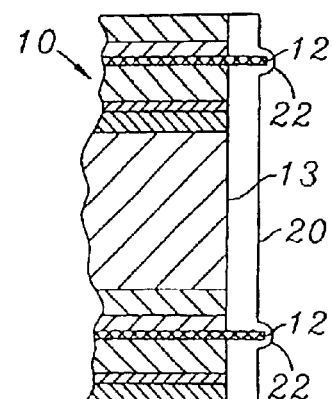
FIGS. 3–4 are views of a prior art method of providing contact leads through insulating material along the stacked edge face.
Figure 4:
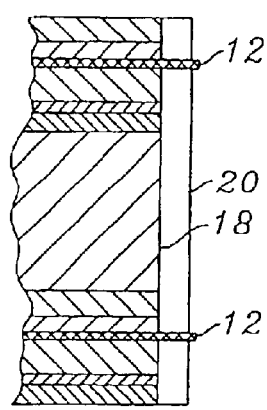

An existing method to provide protruding contact leads 12, from an insulating layer 20 overlying edges 13 of stacked electronics 10, is described in connection with FIGS. 3 and 4. The substrate edges 13 are etched back leaving protruding contact leads 12. An insulating layer 20 is then deposited on the edges 13. The tips 22 of the insulating layer 20 over the contact leads 12 are then lightly lapped to expose the metal contact leads 12, and the deposited layer 20 is delineated.

FIGS. 5–8 illustrate preferred embodiments of the present invention. The present invention takes advantage of optical differences between the conductive and non-conductive materials along the edge face 13, by using the reflected light from the metal contact leads 12 to define the contact pads in an insulating layer of polymer 25. The first embodiment is a two-pass method which uses a layer of conventional positive photo-resist or polyamide polymer 25 that contains up to twenty five percent of an inhibitor that prevents attack by a developer. A conventional light-sensitive polymer 25 is suitable for use in this embodiment. After a proper cleaning, the polymer 25 is applied to the stack edge 13 at a thickness from 0.3 to 0.45 microns. Adhesion promoters or primers are sometimes used prior to resist application. The polymer 25 may be subjected to a pre-exposure bake to eliminate residual solvents, promote adhesion, and harden the resist.

Figure 5:
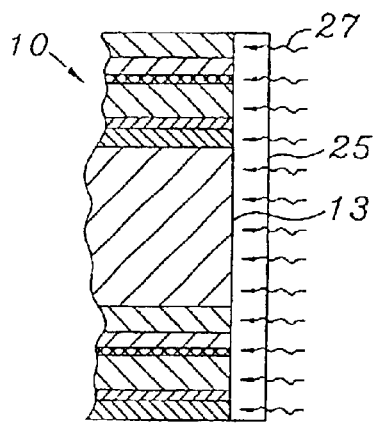
FIGS. 5–7 are views of a preferred embodiment of the self-aligning method of the present invention.
Figure 6:
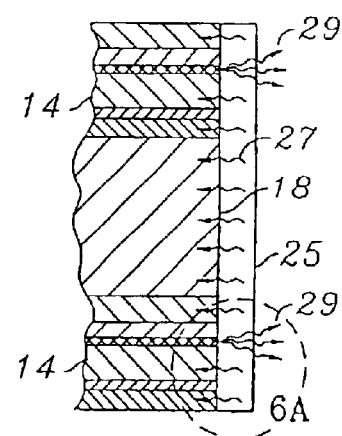
Figure 6A:
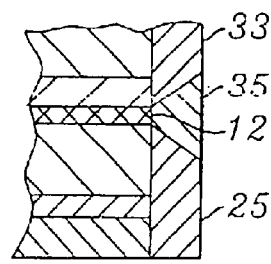

In the two pass method, a layer of polymer 25 and incident light 27 have been selected such that one pass of the incident light 27 will not provide sufficient incident radiation to destroy the inhibitor in the polymer 25, but two passes of light will make the polymer 25 soluble by the developer. FIG. 5 shows a wide stream of well collimated incident light 27 is directed at a first portion 33 (FIG. 6a) of the polymer 25. FIG. 6 shows that when the incident light 27 reflects off of the metal contact leads 12, the reflected light 29 disperses to pass through a second portion 35 (FIG. 6a) of the polymer 25. The dispersion of the reflected light 29 is approximately 1 micron. The reflected light 29 should be approximately in phase with the incident light 27. The polymer 25 is exposed using an incident light 27 which provides optical energy of an appropriate intensity over a wavelength band within the resist absorption spectrum of the inhibitor in the polymer 25. The wavelength of the incident light 27 is in the near infrared range from 0.3–0.45 microns. The exposing system should provide incident light 27 of uniform illumination over the polymer 25, the light incident 27 substantially collimated (parallel rays) and substantially coherent (constant phase). The incident light 27 is preferably directed approximately normal to the layer 25 so that the material removed is normal to the metal contact leads 12. Then, the developer is preferably applied by spraying, rather than immersion, to delineate the voids 30 in the polymer 25, in the regions common to the first 33 and second 35 portions. (See FIG. 7). The diameter of the voids is approximately 1–2 microns. The developer applied is a conventional alkaline aqueous-based solvent. Conventional contact pads (not shown) may be formed in the voids 30.

Figure 7:
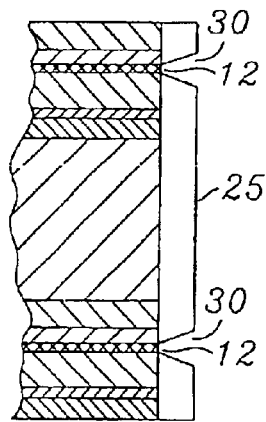

FIGS. 5–7 also illustrate a second embodiment, a wave-cancellation method. The method uses an insulating layer of polymer 25 of a conventional negative photo-responsive material containing a small percentage of light-sensitive molecules (activators). The activators absorb incident radiation within the polymer 25 and promote cross-linking of the small molecules (monomers) into very large molecules (macromolecules) that are infusible. A conventional light-sensitive polymer 25 is used in this embodiment. Incident light 27 of the appropriate wavelength is directed at the polymer 25, substantially normal to the polymer 25. The incident light 27 reflects off the metal contact leads 12 to become reflected light 29. The reflected light 29 should be substantially out of phase with the incident light 25. The reflected light 29 is operative to effectively cancel the first pass of incident light 27 through those areas, as the sum of the amplitude of the out of phase light is near zero. Control of the polymer 25 thickness is important for the wave front cancellation.

Figure 8:
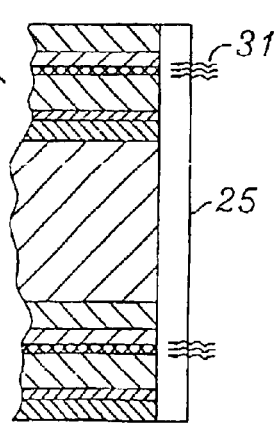
FIG. 8 is a view of an alternate embodiment of the self-aligned method of the present invention.

A third embodiment, a laser interrogation method, is further illustrated by FIG. 8. The method includes applying an insulating layer of polymer 25 of conventional positive light-sensive material. A first laser beam incident light 27 is serially directed at the polymer 25 at a multiplicity of locations, the entire sequence of which is also illustrated by FIG. 5. For this embodiment it is particularly important that the incident light 27 is directed closely normal to the layer of polymer 25, since only a narrow beam of laser beam incident light 27 is used. The first laser beam incident light 27 is outside the absorption spectrum of the polymer 25. Incident light 27 directed at the underlying $SiO_2$ layer 14 and substrate layer 18 are absorbed (FIG. 6). Incident light 27 directed at the metal contact leads 12 is reflected back 29 (FIG. 6) and detected by the laser unit (not shown). The laser unit directs a second laser beam incident light 31 (FIG. 8) at the location of the reflected back light 29. The second laser beam incident light 31 is of a wavelength within the absorption spectrum of the polymer 25. Then, the developer is applied delineating voids 17 similar to the pattern shown in FIG. 2. Optionally, conventional negative light-sensitive polymer 25 could instead be used for the insulating layer, and the second laser beam incident light 31 (not shown) would then be serially directed at those locations of the polymer 25 where reflected light 29 is not detected.

Also optionally, the laser unit (not shown) includes a computer control program coupled to the laser unit, the program having stored in memory the approximate locations of the metal contact leads 12. The locations typically follow a regular pattern that would be easy for an operator to input. The computer control program allows the laser unit to reject false reflections from stray metal particles that do not follow the regular pattern of contact leads 12.

It is understood that the exemplary method of providing self-aligned contacts for stacked electronics described herein and shown in the drawings represents only presently preferred embodiments of the invention. Indeed, various modifications and additions may be made to such embodiments without departing from the spirit and scope of the invention. By way of example only, the methods of the present invention could be used to delineate material removal in insulating layers overlying conventional metalized conduits formed on silicon substrates. These and other modifications and additions may be obvious to those skilled in the art and may be implemented to adapt the present invention in a variety of different applications.

What is claimed is:

1. A method for delineating removal of a positive light-sensitive polymer, containing an inhibitor, overlying a conductive material, the method comprising the steps of:

directing an incident light at the polymer;
   passing the incident light through a first portion of the polymer;
   reflecting the incident light off the conductive material;
   passing the reflected light back through second portion of the polymer, the reflected light being approximately in phase with the incident light;
   neutralizing the inhibitor in the polymer in regions common to both the first and second portions;
   applying a solvent developer to the polymer; and
   dissolving the polymer in the common regions wherein the inhibitor has been neutralized.

2. The method of claim 1, wherein the conductive material includes metal contact leads between non-conductive substrate layers.

3. The method of claim 1, wherein the conductive material includes metalized conduits formed on a non-conductive substrate.

4. The method of claim 1, wherein the incident light is dispersed to approximately uniformly illuminate the polymer first portion.

5. The method of claim 1, wherein the incident light is simultaneously directed at a multiplicity of locations upon the polymer first portion.

6. The method of claim 1, wherein the incident light is serially directed at a multiplicity of locations upon the polymer first portion.

7. The method of claim 1, wherein the incident light is substantially collimated.

8. The method of claim 1, wherein the light is substantially coherent.

9. The method of claim 1, wherein the wavelength of the incident light is 0.3 to 0.45 microns.

10. The method of claim 1, wherein the thickness of the light sensitive polymer is 0.3 to 0.45 microns.

11. A method for delineating removal of a negative light-sensitive polymer, having molecules capable of cross-linking, overlying conductive material, the method comprising:

directing an incident light at the polymer;
   passing the incident light through a first portion of the polymer;
   reflecting the incident light off the conductive material;
   passing the reflected light back through a second portion of the polymer, the wavelength of the reflected light being substantially 180° out of phase with the incident light;
   cross-linking molecules in the polymer only in regions not common to both the first portion and the second portion;
   applying a solvent developer to the polymer; and
   dissolving the polymer in the regions common to both the first and second portions where the cross-linking has not been activated.

12. The method of claim 11, wherein the incident light is directed substantially normal at the polymer.

13. The method of claim 11, wherein the incident light includes near infrared light.

14. The method of claim 13, wherein the incident light has a wavelength between 0.3 and 0.45 microns.

15. A method for delineating removal of light-sensitive polymer overlying a conductive material, the method comprising:

directing a first incident light at a first portion of the polymer;
   passing the first incident light through the polymer;
   reflecting the reflected light off the conductive material;
   detecting the reflected light;

directing a second incident light at a second portion of the layer where the reflected light was detected;

applying a solvent developer to the polymer; and dissolving only the second portion of the polymer.

16. A method for delineating removal of a positive light-sensitive polymer, containing an inhibitor, overlying a conductive material, the method comprising:

directing a first incident light at the polymer;

passing the first incident light through the polymer;

reflecting the first incident light off the conductive material;

detecting the reflected light;

directing a second incident light at a second portion of the layer where the reflected light was detected;

neutralizing the inhibitor in the polymer only in the second portion;

applying a solvent developer to the polymer; and dissolving the polymer only in the second portion where the inhibitor has been neutralized.

17. The method of claim 16, further comprising:

comparing where the reflected light is received to an expected location of the reflected light, prior to directing the second incident light; and directing the second incident light at the second portion of the layer where the reflected light approximately coincide with the expected location only.

18. A method for delineating removal a negative light-sensitive polymer, having a molecules capable of cross-linking, overlying a conductive material, the method comprising:

directing a first incident light at the polymer;

passing the first incident light through the polymer;

reflecting the first incident light off the conductive material;

detecting the reflected light;

directing a second incident light at a second portion of the polymer where reflected light was not detected;

cross-linking molecules in the polymer only in the second portion;

applying a solvent developer to the polymer; and dissolving the polymer only in the second portion where the inhibitor has been neutralized.

19. A method for forming self-aligned contact for a conductive material of a stacked electronics, the method comprising:

forming a negative polymer on the stacked electronics to cover the conductive material, the polymer being infusible for a developer when an incident light is radiating thereon;

radiating the incident light upon the polymer;

reflecting the incident light off the conductive material, so as to cancel radiation of the incident light upon the polymer over the conductive material; and applying the developer to the polymer to dissolve the polymer over the conductive material.

20. The method of claim 19, wherein the negative polymer comprises a percentage of activators to cross link small molecules into large molecules when the polymer is subjected to radiation of the incident light.

21. The method of claim 19, wherein the incident light includes an infrared light.

22. The method of claim 19, wherein the step of reflecting the incident light includes reflecting the incident light into a reflected light substantially 180° out of phase with the incident light.

23. The method of claim 19, wherein the step of applying the developer includes spraying the developer upon the polymer.

* * * * *